(12) United States Patent
Odaka et al.

(10) Patent No.: US 6,821,617 B2
(45) Date of Patent: Nov. 23, 2004

(54) WAFER AND PRODUCTION THEREOF

(75) Inventors: Fumio Odaka, Saitama-ken (JP); Sho Kumagai, Tokyo (JP); Toshikazu Shinogaya, Tokyo (JP)

(73) Assignee: Bridgestone Corporation, Tokyo (JP)

( * ) Notice: Subject to any disclaimer, the term of this patent is extended or adjusted under 35 U.S.C. 154(b) by 62 days.

(21) Appl. No.: 10/098,389

(22) Filed: Mar. 18, 2002

(65) Prior Publication Data

US 2003/0036245 A1 Feb. 20, 2003

(30) Foreign Application Priority Data

Mar. 19, 2001 (JP) ..................................... P2001-079557

(51) Int. Cl.[7] .............................................. C04B 41/80
(52) U.S. Cl. ....................................... 428/332; 428/336
(58) Field of Search ............................... 423/344–345; 264/29.1, 29.7, 63–66; 428/332, 336

(56) References Cited

U.S. PATENT DOCUMENTS 6,013,236 A * 1/2000 Takahashi et al. .......... 423/345
6,054,000 A * 4/2000 Hanzawa ..................... 156/99
6,187,704 B1 * 2/2001 Takahashi et al. ............ 501/90

FOREIGN PATENT DOCUMENTS

EP 63627 A * 10/1982 ........... F16K/11/20

* cited by examiner

Primary Examiner—David Nelms
Assistant Examiner—David Vu
(74) Attorney, Agent, or Firm—Sughrue Mion, PLLC

(57) ABSTRACT

A method of producing a wafer comprising conducting a baking treatment on a sintered silicon carbide cut in the form of wafer. An embodiment in which the temperature for the above-mentioned baking treatment is 1350° C. or more, embodiments in which the temperature for the above-mentioned baking treatment is 1400 to 1550° C. and the pressure for the above-mentioned baking treatment is $10^{-4}$ Torr or less, and the like are preferable. A wafer which can be produced by the above-mentioned method of producing a water. Embodiments in which the above-mentioned flexural strength measured by a flexural test method (JIS 1601) is 700 MPa or more, the above-mentioned element composition ratio Si/C in all parts is 0.48/0.52 to 0.52/0.48, and the above-mentioned density is 2.9 g/cm$^3$ or more.

A high quality wafer improving thermal shock resistance and generating no crack by thermal shock, and a method which can produce this wafer efficiently are provided.

12 Claims, 1 Drawing Sheet

FIGURE
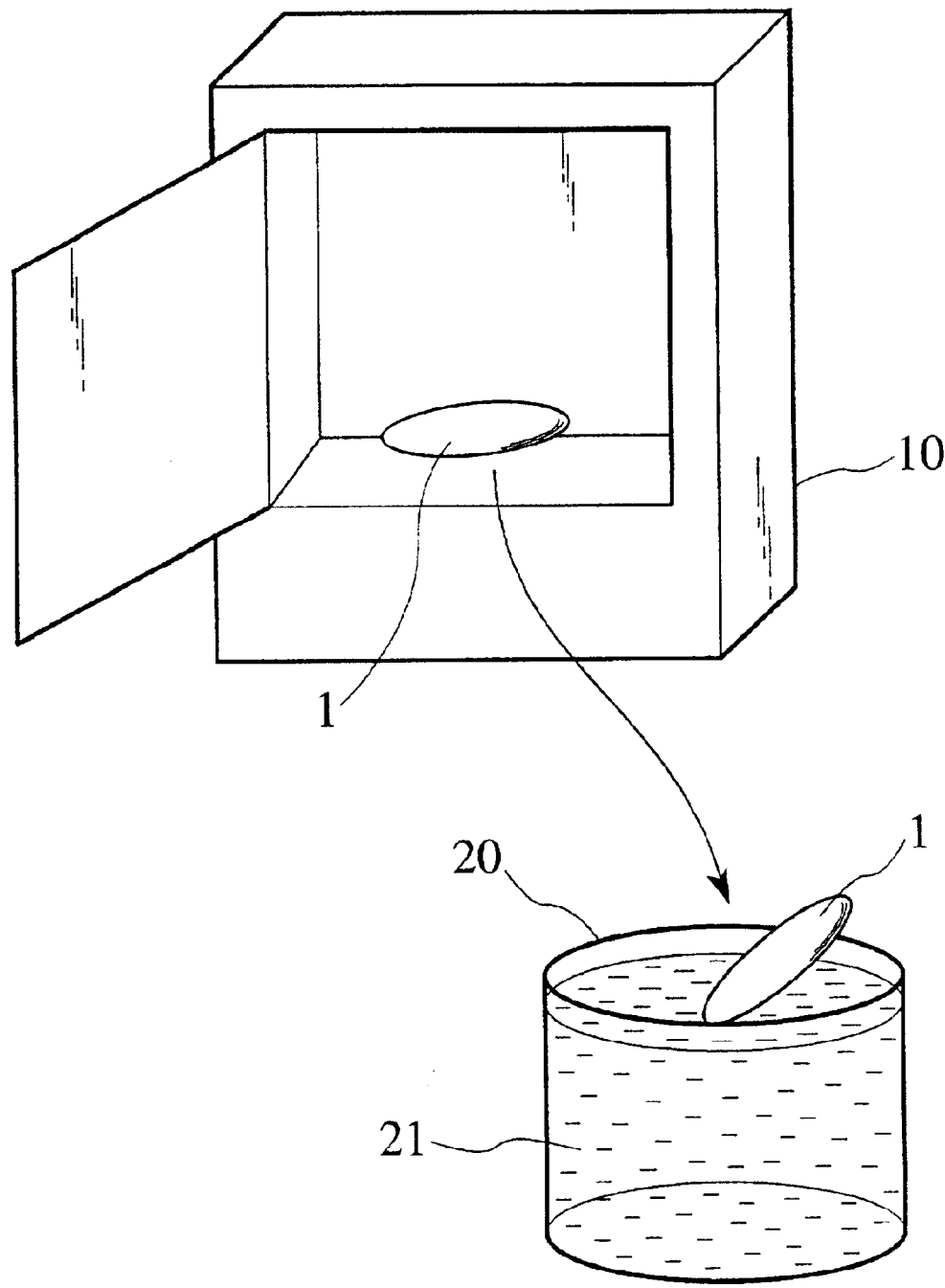

WAFER AND PRODUCTION THEREOF

RELATED APPLICATION

This application claims benefit of priority under 35 USC 119 based on Japanese Patent Application P2001-79557, filed Mar. 19, 2001, the entire contents of which are incorporated by reference herein.

BACKGROUND OF THE INVENTION

1. Field of the Invention

The present invention relates to a wafer used for evaluation of uniformity of furnace temperature, gas concentration and the like, removal of polluting materials, determination of various conditions, and the like, in production of silicon wafers (hereinafter, referred to as "dummy wafer" in some cases), and a method of producing the same.

2. Description of the Related Art

In a process of producing a semiconductor such as LSI and the like, a process of oxidizing the surface of a wafer, a process of diffusing doping elements such as phosphorus, boron and the like in wafer, a process of forming various films on the surface of a wafer by CVD (chemical vapor deposit) or PVD (physical vapor deposit) and the like are important, and the way of keeping treatment conditions in these processes constant is important in improving the yield of an article and producing a more highly-integrated device. In general, in these processes, a boat charged with 100 or more wafers is placed in a treating furnace and subjected to a batch treatment.

In the batch treatment, however, there are problems such as generation of a difference in temperature in the above-mentioned treating furnace, a difference in temperature of a raw material gas, and the like. Therefore, the difference in temperature in the above-mentioned treatment furnace, difference in temperature of a raw material gas, and the like are tried to be solved by placing a dummy wafer not used as a product wafer, at positions revealing a fear of differences of conditions such as temperature in the above-mentioned treating furnace, temperature of a raw material gas, and the like from given conditions, and analyzing whether the thickness, components and the like of a thin film formed in the dummy wafer are the same as in the case of a wafer placed under given conditions, or not. Further, this dummy wafer is used also for the purpose of investigating conditions for a plasma treatment in an etching treatment apparatus and removing particles generated in the apparatus.

Such a dummy wafer is generally used at high temperatures repeatedly, and treated with an acid repeatedly for periodic use by removing films formed thereon. Conventionally, as the material of this dummy wafer, the same silicon, quartz and the like have been used as in the case of materials of usual product wafers. However, in the case of a dummy wafer formed of silicon, since heat resistance is not so good, the form tends to change by time and acid resistance is not sufficient, therefore, the surface thereof is roughened owing to solution, particles are liable to be formed, and the life is short. On the other hand, in the case of a dummy wafer formed of quartz, heat resistance and acid resistance is not sufficient, and an etching treatment and the like cannot be effected due to no-conductivity. Accordingly, carbon materials excellent in heat resistance and ceramics materials excellent in acid resistance are expected as the material of a dummy wafer instead of silicon and quartz, and of them, a sintered silicon carbide is most highly expected since constituent elements thereof manifest no problems on the semiconductor device product.

However, since silicon carbide is a material, which is not easily sintered, it has been usual to add small amount of boron carbide, alumina and the like as aids for the sintering. Because these aids are impurities for a dummy wafer, methods of producing a sintered silicon carbide are recently provided. For example, there are i) a method in which a fine particle is formed by gas phase growth and the formed powder is used as a raw material to produce a sintered body, ii) a method in which a sintered body in the form of plate is directly produced by gas phase growth, and the like, using as a raw material a gas and solution containing silicon and carbon.

A wafer made of a sintered silicon carbide obtained by these methods is generally produced by a method in which a sintered silicon carbide obtained by molding a silicon carbide powder by a hot press method and the like is sliced by discharge processing and the like, then, chamfer, washing, drying, polishing and the like are effected. Since thus obtained wafer has a problem of a tendency of crack generation, a solution thereof is desired and particularly, it is desired that crack does not occur in imparting thermal shock.

SUMMARY OF THE INVENTION

An object of the present invention is to provide a high quality wafer which improves thermal shock resistance, causes no generation of crack by thermal shock, and suitably used for evaluation of uniformity of furnace temperature, gas concentration and the like, removal of polluting materials, determination of various conditions, and the like, in production of silicon wafers (dummy wafer), and a method capable of producing this wafer efficiently.

In the first aspect of the present invention, this invention provides a method of producing a wafer comprising: preparing a sintered silicon carbide cut in the form of wafer; and subjecting the sintered silicon carbide to a baking treatment. In another word, this invention provides a method of producing a wafer comprising: preparing a wafer which is obtained by cutting a sintered silicon carbide; and subjecting the wafer to a baking treatment to reduce process residual stress.

In the second aspect of the present invention, this invention provides a wafer produced by the above-mentioned method.

In the method of producing a wafer of the present invention, a baking treatment is effected on a sintered silicon carbide cut in the form of wafer. By this baking treatment, process residual stress accumulated before the above-mentioned baking treatment in the above-mentioned sintered silicon carbide is removed. By this, in the resulted wafer, generation of crack in receiving thermal shock is effectively suppressed.

In the wafer of the present invention, stress imparted in processing does not remain and generation of crack in receiving thermal shock is effectively suppressed, since this wafer is produced by the above-mentioned method of producing a wafer of the present invention.

BRIEF DESCRIPTION OF THE DRAWINGS

Other objects, features, and advantages of the invention will become apparent from the following description taken together with the drawings, in which:

FIG. 1 is a schematic view for illustrating a thermal shock resistance test according to a dropping-in-water method.

Explanation of Marks

1: Wafer
10: Oven
20: Vessel
21: Water

DESCRIPTION OF THE PREFERRED EMBODIMENTS

Method of Producing Wafer

The method of producing a wafer of the present invention will be described below.

In the method of producing a wafer of the present invention, a baking treatment is conducted on a sintered silicon carbide cut in the form of wafer.

The temperature for the above-mentioned baking treatment can be appropriately selected depending on the object, and is 1000° C. or more, preferably 1200° C. or more, more preferably from 1200 to 1600° C.

Preferable is a temperature for the above-mentioned baking treatment of 1000° C. or more since then thermal shock resistance is improved and generation of crack by thermal shock is suppressed, more preferable is a temperature from 1200 to 1600° C. since then thermal shock resistance is further improved and generation of crack by thermal shock is effectively suppressed, and particular preferable is a temperature from 1350 to 1600° C. since then, additionally, a carbonization phenomenon is also effectively suppressed, and the element composition ratio Si/C in all parts of a wafer can be maintained at from 0.48/0.52 to 0.52/0.48.

In the present invention, the above-mentioned baking treatment can be conducted in a plurality of stages, and in this case, it is preferable that at least one stage is performed at 1000° C. or more. As the embodiment of effecting the above-mentioned baking treatment in a plurality of stages, there are particularly preferably listed, for example, an embodiment in which the treatment is conducted at around 1000° C. before the treatment at from 1350 to 1550° C., and other embodiments.

The temperature rising speed in heating up to the temperature of the above-mentioned baking treatment can be appropriately selected depending on the object, and is from about 1 to 20° C./min., preferably from about 3 to 12° C./min.

Preferable is a temperature rising speed described above of about 3 to 12° C./min. since then the resulted wafer has improved thermal shock resistance and generation of crack by thermal shock is effectively suppressed.

The pressure for the above-mentioned baking treatment is not particularly restricted and can be appropriately selected depending on the object, and preferably $10^{-4}$ Torr ($1.3 \times 10^{-2}$ Pa) or less.

A pressure for the above-mentioned baking treatment of $10^{-4}$ Torr ($1.3 \times 10^{-2}$ Pa) or less is preferable since then a purification effect is also obtained.

The time for the above-mentioned baking treatment is not particularly restricted and can be appropriately selected depending on the object, and preferably from about 0.2 to 6.0, more preferably from about 0.5 to 3.0 hours.

Times for the above-mentioned baking treatment in the above-mentioned range are preferable since then processing stress remaining in a wafer can be effectively removed, and productivity thereof is excellent.

Even if the above-mentioned baking treatment is conducted in a plurality of stages, it is preferable, in the embodiment in which the treatment is conducted at around 1000° C. before the treatment at from 1200 to 1600° C., that the treatment time at around 1000° C. is from about 1 to 6 hours and the treatment time at from 1200 to 1600° C. is in the above-mentioned range.

The above-mentioned baking treatment can be conducted using known heating treatment apparatuses, for example, such a heat treatment apparatus as used for sintering of silicon carbide, and as the heat treatment apparatus, for example, a heat treatment furnace and the like are suitably listed. As the heating mode of this heating apparatus, a resistance heating mode or a dielectric heating mode may be permissible.

The cooling speed after the above-mentioned baking treatment can be appropriately selected depending on the object, and usually from about 0.1 to 20° C./min., preferably from about 0.5 to 8° C./min.

The above-mentioned temperature rising speed of from about 0.5 to 8° C./min. is preferable since then the resulted wafer has improved thermal shock resistance and generation of crack by thermal shock is suppressed effectively.

The cooling atmosphere after the above-mentioned baking treatment can be appropriately selected depending on the object, and a high purity nitrogen gas atmosphere is preferable from the standpoint of cost.

In the present invention, before the above-mentioned baking treatment, chamfer, washing, drying, polishing and the like can be appropriately effected depending on the object after cutting of a sintered silicon carbide in the form of wafer.

These treatments can be conducted according to known methods using known machines, instruments, apparatuses and the like.

The above-mentioned sintered silicon carbide is obtained by sintering a silicon carbide powder.

The method of the above-mentioned sintering is not particularly restricted, and a reaction sintering method, hot press method and the like are mentioned, and a hot press method is preferable from the standpoint of production easiness.

Regarding the above-mentioned silicon carbide powder, purity, production method thereof and the like are not particularly restricted and can be appropriately selected depending on the object.

The above-mentioned purity is preferably higher, and the content of impurity elements is 0.5 ppm or less.

The above-mentioned content of impurity elements is a content of impurities measured by chemical analysis and only has a meaning as a reference value. Practically, the evaluation differs also depending on whether the above-mentioned impurity elements are distributed uniformly or locally distributed unevenly in the above-mentioned sintered silicon carbide. Here, "impurity element" means an element belonging to groups I to XVI of the periodic table according to IUPAC Inorganic Chemistry Nomenclature, Revision, 1989 and having an atomic number of 3 or more (excluding atomic numbers 6 to 8, and 14).

The above-mentioned silicon carbide powder is obtained, for example, by dissolving at least one silicon compound as a silicon source, at least one organic compound generating carbon by heating, and a polymerization catalyst or cross-linking catalyst in a solvent, drying the solution to obtain a powder, and calcinating the powder in a non-oxidizing atmosphere.

As the above-mentioned silicon compound, a liquid compound and solid compound can be used together, but at least one silicon compound is selected from liquid compounds.

As the above-mentioned liquid compound, alkoxysilane and tetraalkoxysilane polymers are preferably used.

As the above-mentioned alkoxysilane, for example, methoxysilane, ethoxysilane, propoxysilane, butoxysilane and the like are mentioned, and of them, ethoxysilane is preferable from the standpoint of handling.

The above-mentioned alkoxysilane may be any of monoalkoxysilane, dialkoxysilane, trialkoxysilane and tetraalkoxysilane, and tetraalkoxysilane is preferable.

As the above-mentioned tetraalkoxysilane, low molecular weight polymers having a degree of polymerization of about 2 to 15 (oligomer) and silic acid polymers are mentioned.

As the above-mentioned solid compound, silicon oxides such as SiO, silica sol (liquid containing ultrafine silica in the form of colloid, containing inside a OH group and an alkoxyl group), silicon dioxide (silica gel, fine silica, quartz powder) and the like are mentioned.

The above-mentioned silicon compound may be used alone or in combination of two or more.

Among the above-mentioned silicon compounds, an oligomer of tetraethoxysilane, a mixture of an oligomer of tetraethoxysilane and fine powder silica, and the like are preferable since homogeneity and handling property thereof are excellent.

The above-mentioned silicon compound preferably has high purity, and those having a content of each impurity at the initial period of 20 ppm or less are preferable, and those of 5 ppm or less are more preferable.

Regarding the above-mentioned organic compound generating carbon by heating, a liquid compound may be used alone or a liquid compound and a solid compound may be used together.

As the above-mentioned organic compound generating carbon by heating, organic compounds having a high carbon remaining rate and showing polymerization or cross-linking with the aid of a catalyst or by heating are preferable, and preferable are, for example, monomers and prepolymers of resins such as phenol resins, furan resins, polyimides, polyurethanes, polyvinyl alcohol and the like, and additionally, liquid materials such as cellulose, saccharose, pitch, tar and the like are mentioned. Of them, those of high purity are preferable, phenol resins are more preferable, resol-type phenol resins are particularly preferable.

The above-mentioned organic compound generating carbon by heating may be used alone or in combination of two or more.

The purity of the above-mentioned organic compound generating carbon can be appropriately selected depending on the object, and when a silicon carbide powder of high purity is necessary, it is preferable to use organic compounds not containing each metal in amount of 5 ppm or more.

The above-mentioned polymerization catalyst and cross-linking catalyst can be appropriately selected depending on the above-mentioned organic compound generating carbon by heating, and when the above-mentioned organic compound generating carbon by heating is selected from phenol resins and furan resins, acids such as toluenesulfonic acid, toluenecarboxylic acid, acetic acid, oxalic acid, sulfuric acid and the like are preferable, and toluenesulfonic acid is particularly preferable.

The ratio of carbon atoms contained in the above-mentioned organic compound generating carbon by heating to silicon atoms contained in the above-mentioned silicon compound (hereinafter, abbreviated as "C/Si ratio") is defined by element analysis of a carbide intermediate obtained by carbonizing a mixture of both compounds at 100° C. From stoichiometric standpoint, though the content of free carbon in a silicon carbide powder obtained when the above-mentioned C/S ratio is 3.0 should be 0%, free carbon is formed, in fact, at lower C/S ratio by vaporization of a SiO gas produced simultaneously. It is preferable to determine the compounding ratio previously so that this free carbon content in the resulted silicon carbide powder reaches a suitable value. Usually, in sintering at 1600° C. or more around 1 atom, free carbon can be suppressed when the above-mentioned C/S ratio is controlled to 2.0 to 2.5. When the above-mentioned C/S ratio is over 2.5, the above-mentioned free carbon content increases remarkably. However, when sintering is conducted at lower or higher atmosphere pressure, the C/Si ratio for obtaining a pure silicon carbide powder varies, therefore, the C/Si ratio is not necessarily restricted in the above-mentioned range, in this case.

The above-mentioned silicon carbide powder is obtained also by, for example, hardening a mixture of the above-mentioned silicon compound and the above-mentioned organic compound generating carbon by heating.

As the above-mentioned hardening method, a method of cross-linking by hearing, a method of hardening using a hardening catalyst, methods using electron beam and radiation, and the like are mentioned.

The above-mentioned hardening catalyst can be appropriately selected depending on the kind of the above-mentioned organic compound generating carbon by heating, and the like, and in the case of phenol resins and furan resins, acids such as toluenesulfonic acid, toluenecarboxylic acid, acetic acid, oxalic acid, hydrochloric acid, sulfuric acid, maleic acid and the like, amines such as hexamine, and the like are suitably listed. When these hardening catalysts are used, the hardening catalyst is dissolved or dispersed in a solvent. As the above-mentioned solvent, lower alcohols (for example, ethyl alcohol and the like), ethyl ether, acetone and the like are listed.

A silicon carbide powder obtained as described above is sintered in a non-oxidizing atmosphere such as nitrogen or argon and the like at 800 to 1000° C. for 30 to 120 minutes.

By the above-mentioned sintering, the above-mentioned silicon carbide powder is converted into carbide, and a silicon carbide powder is produced by sintering the above-mentioned carbide in a non-oxidizing atmosphere such as argon and the like at 1350 to 2000° C.

The above-mentioned temperature and time for sintering can be appropriately selected depending on the particle size and the like of a silicon carbide powder to be obtained, and the above-mentioned temperature is preferably from 1600° C. to 1900° C. from the standpoint of more efficient production of a silicon carbide powder.

It is preferable to conduct heating treatment at 2000 to 2100° C. for 5 to 20 minutes after the above-mentioned sintering, for the purpose of removing impurities and obtaining a silicon carbide powder of high purity.

Since a silicon carbide powder obtained as described above is nonuniform in size, desired particle size can be obtained by effecting powder grinding, classification and the like.

The average particle size of the above-mentioned silicon carbide powder is preferably from 10 to 700 $\mu$m, more preferably from 100 to 400 $\mu$m.

Into the above-mentioned sintered silicon carbide obtained by sintering the above-mentioned silicon carbide powder can be introduced nitrogen or aluminum for the purpose of imparting n-type or p-type conductivity, and when nitrogen or aluminum is introduced in production of the above-mentioned silicon carbide powder, it is advantageous to first mix uniformly an organic substance composed of the above-mentioned silicon source, the above-mentioned carbon source, and nitrogen source or aluminum source, and the above-mentioned polymerization catalyst or cross-linking catalyst.

In this case, for example, it is preferable, in dissolving an organic substance composed of a carbon source such as a phenol resin and the like and a nitrogen source such as hexamethylenetetramine and the like and a polymerization catalyst or cross-linking catalyst such as toluenesulfonic acid and the like in a solvent such as ethanol and the like, to effect sufficient mixing thereof with a silicon source such as an oligomer of tetraethoxysilane and the like.

As the above-mentioned organic substance composed of a nitrogen source, a substance generating nitrogen by heating is preferable, and for example, polymer compounds (specifically, polyimide resins, nylon resins and the like), and various amines such as organic amines (specifically, hexamethylenetetramine, ammonia, triethylamine and the like, and compounds and salts thereof) are listed. Of them, hexamethylenetetramine is preferable. Further, a phenol resin synthesized by using hexamine as a catalyst and containing nitrogen derived from the synthesis process in an amount of 2.0 mmol or more based on 1 g of the resin can also be used suitably as the above-mentioned organic substance composed of a nitrogen source. These organic substances composed of a nitrogen source may be used alone or in combination of two or more. The above-mentioned organic substance composed of an aluminum source is not particularly restricted and can be appropriately selected depending on the object.

Regarding the addition amount of the above-mentioned organic substance composed of a nitrogen atom, when the above-mentioned silicon source and the above-mentioned carbon source are added simultaneously, nitrogen is contained in an amount of preferably 1 mmol or more based on 1 g of the above-mentioned silicon source and in an amount of 80 to 1000 $\mu$g based on 1 g of the above-mentioned silicon source.

According to the method of producing a wafer of the present invention, a high quality wafer excellent in thermal shock resistance and revealing no generation of crack by thermal shock can be efficiently produced.

Wafer

The wafer of the present invention (dummy wafer) is suitably produced by the above-mentioned method of producing a wafer of the present invention.

The flexural strength of the wafer of the present invention is preferably 600MPa or more, more preferably 650MPa or more, in terms of a value measured according to the flexural strength test method (JIS 1601).

The above-mentioned flexural strength of 600MPa or more is preferable since the flexural strength when the above-mentioned baking treatment is not conducted is less than 600MPa.

The thermal conductivity of the wafer of the present invention is preferably 100W/m·K or more, more preferably 180 W/m·K or more.

When the above-mentioned thermal conductivity is 100W/m·K or more, a difference in temperature scarcely occurs between the surface and the inner part of a wafer in heating.

The thermal conductivity can be measured by a laser flash method using a heat constant measuring apparatus (FA8510B, manufactured by Rigaku Denki K. K.).

The density of the wafer of the present invention is preferably 2.9 g/cm$^3$ or more, more preferably 3.0 g/cm$^3$ or more.

When the above-mentioned density is less than 2.9 g/cm$^3$, the mechanical strengths such as the flexural strength, crash strength and the like of the wafer lower, and when used repeatedly, deformation and breakage such as crack and the like may be caused in some cases. Further, heat resistance, oxidation resistance and chemical resistance also decreases, causing a tendency of corrosion in some cases.

The above-mentioned density can be measured by an Archimedes' method.

The surface roughness (Ra) of the wafer of the present invention is preferably from 0.01 to 2.0 $\mu$m.

The above-mentioned surface roughness (Ra) in the above-mentioned range is preferable since then generation of particles can be prevented.

The above-mentioned surface roughness (Ra) can be measured by using a surface roughness meter.

The volume resistivity of the wafer of the present invention is preferably 1.0$\Omega$·cm or less.

When the above-mentioned volume resistivity is over 1.0$\Omega$·cm, a discharge processing may be difficult. For the purpose of suppressing the volume resistivity within the above-mentioned range, the above-mentioned wafer can be allowed to contain given amount of nitrogen. The content of nitrogen is preferably 150 ppm or more, more preferably 200 ppm or more. It is preferable that nitrogen is contained in the form of solid solution from the standpoint of safety.

The content of $\beta$-type silicon carbide in the wafer of the present invention is preferably 70% by weight or more, more preferably 80% by weight or more based on the all silicon carbide components from the standpoint of improving the isotropy of mechanical strength.

The Young's modulus of the wafer of the present invention is preferably from 3.5$\times$10$^4$ to 4.5$\times$10$^4$ kgf/mm$^2$ (3.4$\times$10$^5$ to 4.4$\times$10$^5$ MPa).

The Vickers hardness of the wafer of the present invention is preferably 2000 kgf/mm$^2$ (18000 to 20000 MPa) or more.

The Poisson's ratio of the wafer of the present invention is preferably from 0.14 to 0.21.

The thermal expansion coefficient of the wafer of the present invention is preferably from 3.8$\times$10$^{-6}$ to 4.2$\times$10$^{-6}$/K.

The specific heat of the wafer of the present invention is preferably from 0.15 to 0.18 cal/g·K.

The total content of impurity elements in the wafer of the present invention is preferably 1.0 ppm or less, more preferably 0.8 ppm or less.

When the above-mentioned total content is 1.0 ppm or less, the wafer can be suitably used in various fields as a high performance wafer.

The above-mentioned impurity element means an element belonging to groups I to XVI of the periodic table and having an atomic number of 3 or more (excluding atomic numbers 6 to 8 and 14).

The above-mentioned content can be measured by analysis by ICP-MS of a solution obtained by decomposing the whole wafer with a strong acid.

The wafer of the present invention has sufficiently improved thermal shock resistance as compared with conventional articles, causes no crack by thermal shock and has high quality, consequently, is suitably used for improving thermal shock resistance, causing no generation of crack by thermal shock, evaluating uniformity of furnace temperature, gas concentration and the like in silicon wafer production, removing pollution substances, determining various conditions, and the like.

EXAMPLES

The following examples will describe the present invention, but do not limit the scope of the invention at all.

Example 1

Production of Wafer 680 g of a high purity ethyl silicate oligomer (liquid silicon compound) having a SiO$_2$ content of 40% and 305 g of a high purity liquid resol type phenol resin (organic compound generating carbon by heating) having a water content of 20% were mixed, to this mixture was added 137 g of a 28% aqueous solution of high purity p-toluenesulfonic acid (hardening catalyst), and the mixture was hardened and dried, then, carbonized at 900° C. for 1 hour under a nitrogen atmosphere, to obtain a homogeneous mixed solid.

400 g of the resulted mixed solid was accommodated in a carbon vessel, and heated up to 1750° C. under an argon atmosphere and kept for 30 minutes, then, heated up to 1850° C. and kept for 1 hour. In the above-mentioned process of keeping temperature for 1 hour, an operation of keeping 1850° C. for 15 minutes and an operation of keeping 2030° C. for 5 minutes were repeated alternately three times respectively, to prepare a high purity silicon carbide powder (average particle size: 0.8 $\mu$m).

2700 g of the resulted high purity silicon carbide powder (average particle size: 0.8 $\mu$m) and 300 g of a high purity liquid resol type phenol resin (having a carbon remaining ratio after thermal decomposition of 50%) having a water content of 20% were dispersed in 4500 g of ethyl alcohol, and the dispersion was stirred in a planetary ball mill for 18 hours to give homogenous mixing. Then, the mixture was heated at from 50 to 60° C. to evaporate ethyl alcohol and dry the mixture, and the mixture was passed through a sieve of 100 $\mu$m to obtain a uniform mixture (silicon carbide powder-containing mixture).

The resulted mixture (silicon carbide powder-containing mixture) was sintered as described below, to produce a sintered silicon carbide. Namely, in a graphite mold having an inner diameter of 320 mm was accommodated about 6500 g of the resulted mixture (silicon carbide powder-containing mixture), and this was sandwiched by graphite punches and set in a hot press (hot press apparatus: resistance heating type 400 t hot press). Under vacuum condition ($10^{-5}$ to $10^{-4}$ Torr ($1.3 \times 10^{-2}$ to $1.3 \times 10^{-3}$ Pa)), the temperature was raised up to 700° C. over 8 hours, and kept at this temperature for 1 hour. Then, under vacuum condition ($10^{-5}$ to $10^{-4}$ Torr ($1.3 \times 10^{-2}$ to $1.3 \times 10^{-3}$ Pa)), the temperature was raised from 700° C. to 1200° C. over 3 hours, and further, raised from 1200 to 1500° C. over 3 hours, and kept at this temperature for 4 hours. Then, a pressure of 500 kgf/cm$^2$ (49MPa) was applied, and the temperature was raised from 1500 to 2300° C. over 4 hours under an argon atmosphere, and the same temperature and pressure was kept for 3 hours (hot press process) before cooling. The product was kept at 1950° C. for 3 hours under vacuum condition ($10^{-4}$ Torr ($1.3 \times 10^{-2}$ Pa)), to produce a sintered silicon carbide.

The resulted sintered silicon carbide was sliced at a thickness of 2 mm by discharge processing, then, a washing treatment, surface polishing treatment and the like were performed, to produce a wafer in the form of disk having an outer diameter of 8 inch, a thickness of 0.65 mm and a surface roughness (Ra) of 0.6 $\mu$m.

Then, this wafer was subjected to an annealing treatment under the following conditions. Namely, a resistance heating type large scale heat treatment furnace was used as the apparatus, the annealing temperature was from 1000 to 1600° C., the annealing time was 1 hour (annealing treatment at 1000° C. for 1 to 6 hours), the annealing pressure was vacuum ($10^{-4}$ Torr ($1.3 \times 10^{-2}$ Pa) or less), the temperature rising speed was 8° C./min., The cooling speed was 4° C./min., and the cooling atmosphere was a high purity nitrogen gas atmosphere.

Evaluation of Wafer

The following evaluations were conducted on six wafers obtained as described above (wafer of the present invention) having the above-mentioned annealing temperature of 1000° C., 1200° C., 1350° C., 1400° C., 1450° C. and 1600° C., respectively and a wafer obtained as described above only excepting the above-mentioned annealing treatment (wafer of comparative example).

Thermal Shock Resistance

As shown in FIG. 1, a wafer 1 as an evaluation sample was accommodated in an oven 10, and kept at given temperature for 15 minutes. Then, the wafer 1 was taken out of the oven 10, and dropped in water 21 (about 20 liter, about 20° C.) accommodated in a vessel 20. The evaluation was conducted on cases in which a difference in temperature in dropping into water (difference between water temperature and wafer temperature) was 150° C., 200° C., 250° C., 275° C., 300° C., 325° C., 375° C., 400° C., 425° C. and 450° C., respectively. The results are shown in Table 1. In Table 1, the denominator number means the number of wafers tested, the numerator number means the number of wafers revealed generation of crack, and "-" means no execution of test, in the results described in columns.

TABLE 1

| Annealing temperature | Temperature difference in dropping into water (° C.) | | | | |
| --- | --- | --- | --- | --- | --- |
| | 250 | 275 | 300 | 325 | 350 |
| No treatment | 0/4 | 5/7 | 2/2 | — | — |
| 1000° C. | 0/8 | 0/8 | 6/7 | 3/4 | 0/1 |
| 1200° C. | 0/5 | 3/5 | 1/2 | 1/1 | — |
| 1350° C. | 0/3 | 0/3 | 0/3 | 1/3 | 0/2 |
| 1400° C. | 0/6 | 0/6 | 0/6 | 0/6 | 0/6 |
| 1450° C. | 0/3 | 0/3 | 0/3 | 0/3 | 0/3 |
| 1600° C. | 0/3 | 0/3 | 0/3 | 0/3 | 0/3 |

From the evaluation results shown in Table 1, it is evident that in the wafer of the comparative example which was not subjected to the annealing treatment, crack occurred even if the temperature difference (difference between water temperature and wafer temperature) in dropping into water is small, meaning insufficient thermal shock resistance. On the other hand, in the wafers of the present invention subjected to the annealing treatment, it is evident that the thermal shock resistance is improved, and it is clear that when the annealing temperature is 1350° C., the thermal shock resistance was improved by 50° C. or more as compared with the wafer of the comparative example subjected no annealing treatment, and when the annealing temperature was 1400° C., 1450° C. and 1600° C., the thermal shock resistance was improved by 100° C. or more as compared with the wafer of the comparative example subjected no annealing treatment.

Flexural Strength

When the annealing temperature was 1400° C. and 1600° C., the flexural strength of the resulted wafers was measured according to JIS 1601 (1999). The results are shown in Table 2.

In Table 2, the resulted wafers of the examples and the wafer of the comparative example were allowed to have a size of 4 mm (W)×0.65 mm (t)×40 mm (l) and a surface roughness (Ra) of 0.15 $\mu$m.

TABLE 2

| Flexural strength (MPa) [n = 5, indicated by average value ± standard deviation] Annealing treatment temperature | | |
| --- | --- | --- |
| No treatment | 1400° C. | 1600° C. |
| 554 ± 56 | 739 ± 62 | 753 ± 68 |

From the evaluation results shown in Table 2, it is evident that the specimens of the wafers of the present invention in which the annealing temperature is 1400° C. and 1600° C., the flexural strength is improved by about 150MPa or more as compared with the specimen of the wafer of the comparative example.

Thermal Conductivity

The thermal conductivity of the resulted wafer of the present invention was measured by a known measuring method to find it was 220W/m·K.

Density

The density of the resulted wafer of the present invention was measured by a known measuring method to find it was 3.10 g/cm³.

Total Content of Impurity Elements

The total content of impurity elements in the resulted wafer of the present invention was analyzed and measured by the above-mentioned ICP-MS according to a solution method to find it was 0.75 ppm.

As clearly shown by the result of examples, the present invention can provide a high quality wafer which improves thermal shock resistance, causes no generation of crack by thermal shock, and suitably used for evaluating uniformity of furnace temperature, gas concentration and the like in silicon wafer production, removing pollution substances, determining various conditions, and the like, and a method which can produce this wafer effectively.

It is preferable that a method of producing a wafer comprises: cutting a sintered silicon carbide into a form of wafer, wherein the sintered silicon carbide has a density of 2.9 g/cm³ or more, and is obtained by sintering a mixture of a silicon carbide powder and a non-metal sintering aid; and subjecting the wafer to a baking treatment.

It is preferable that the silicon carbide powder is obtained by sintering a mixture of at least one liquid silicon compound and at least one organic compound which generates carbon in the presence of heat.

It is also preferable that the temperature for the baking treatment is 1200° C. or more, more preferably from 1350 to 1600° C.

What is claimed is:

1. A method of producing a wafer comprising:
   preparing a sintered silicon carbide wafer;
   subjecting the sintered silicon carbide to a baking treatment, wherein the wafer is annealed at a temperature of 1000 to 1600° C. for approximately one hour in a vacuum pressure of approximately $10^{-4}$ Torr or less, wherein the temperature is controlled to rise at a rate of about 8° C./min: and
   cooling the annealed wafer at a rate of about 4° C./min. in an atmosphere of high purity nitrogen.

2. The method according to claim 1, wherein the temperature for the baking treatment is from 1200 to 1600° C.

3. A wafer produced by the method comprising subjecting a sintered silicon carbide wafer to a baking treatment, wherein the wafer is annealed at a temperature of 100 to 1600° C. for approximately one hour in a vacuum pressure of approximately $10^{-4}$ Torr or less, wherein the temperature is controlled to rise at a rate of about 8° C./min. and cooling the annealed wafer at a rate of about 4° C./min. in an atmosphere of high purity nitrogen.

4. The wafer according to claim 3, wherein the baked wafer has a flexural strength measured by the flexural strength test method (JIS 1601) of 650 MPa or more.

5. The wafer according to claim 3, wherein the baked wafer has a thermal conductivity of 100W/m·K or more.

6. The wafer according to claim 3, wherein the baked wafer has a density of 2.9 g/cm³ or more.

7. The wafer according to claim 3, wherein the baked wafer has a surface roughness(Ra) of 0.01 to 2.0 μm.

8. The wafer according to claim 3, comprising elements belonging to groups I to XVI of the periodic table and having an atomic number of 3 or more (excluding atomic numbers 6 to 8, and 14) in a total amount thereof of 1.0 ppm or less.

9. The wafer according to claim 3, wherein the sintered silicon carbide is obtained by sintering a mixture of a silicon carbide powder and a non-metal sintering aid and the silicon carbide powder is obtained by sintering a mixture of at least one liquid silicon compound and at least one organic compound which generates carbon in the presence of heat.

10. The silicon carbide wafer according to claim 3, further comprising a thermal conductivity of at least 100 W/m·k.

11. The silicon carbide wafer as claimed in claim 3, wherein the thermal conductivity is at least 100 W/m·k.

12. The silicon carbide wafer as claimed in claim 3, further comprising a surface roughness approximately equal to between 0.01 μm and 2.0 μm.

* * * * *